(12) United States Patent
Genevaux et al.

(10) Patent No.: US 7,995,413 B2
(45) Date of Patent: Aug. 9, 2011

(54) MEMORY DEVICE THAT TAKES LEAKAGE CURRENTS INTO ACCOUNT IN ACTIVATING THE READ AMPLIFIERS

(75) Inventors: Franck Genevaux, Revel (FR); Alban Forichon, Ngylan (FR)

(73) Assignee: STMicroelectronics S.A., Montrouge (FR)

( * ) Notice: Subject to any disclaimer, the term of this patent is extended or adjusted under 35 U.S.C. 154(b) by 330 days.

(21) Appl. No.: 12/061,238

(22) Filed: Apr. 2, 2008

(65) Prior Publication Data

US 2008/0247251 A1 Oct. 9, 2008

(30) Foreign Application Priority Data

Apr. 2, 2007 (FR) ...................................... 07 02413

(51) Int. Cl.
*G11C 7/02* (2006.01)
(52) U.S. Cl. ................. 365/210.11; 365/49.11; 365/154; 365/188; 365/189.14; 365/189.15; 365/189.05; 365/189.09; 365/190; 365/202; 365/203; 365/205; 365/207; 365/242
(58) Field of Classification Search ............... 365/49.11, 365/154, 188, 189.14, 189.15, 189.05, 189.09, 365/190, 202, 203, 205, 207, 210.11, 242
See application file for complete search history.

(56) References Cited

U.S. PATENT DOCUMENTS

| | | | |
|---|---|---|---|
| 6,512,697 B1 | 1/2003 | Li et al. | |
| 6,950,354 B1* | 9/2005 | Akiyoshi | 365/200 |
| 2004/0174746 A1 | 9/2004 | Bedarida et al. | |
| 2006/0044902 A1 | 3/2006 | Shen et al. | |
| 2006/0050569 A1 | 3/2006 | Shimizu | |
| 2008/0111616 A1* | 5/2008 | Cheng et al. | 327/543 |
| 2008/0205176 A1* | 8/2008 | Jetton et al. | 365/205 |

FOREIGN PATENT DOCUMENTS

| | | |
|---|---|---|
| EP | 0 805 454 | 11/1997 |
| FR | 2 857 091 A | 1/2005 |
| FR | 2 857 149 A | 1/2005 |

OTHER PUBLICATIONS

International Search Report dated Nov. 29, 2007 for French Patent Application 0702413.

* cited by examiner

*Primary Examiner* — Hoai V Ho
*Assistant Examiner* — Fernando N Hidalgo
(74) *Attorney, Agent, or Firm* — Lisa K. Jorgenson; Stephen Bongini; Fleit Gibbons Gutman Bongini & Bianco P.L.

(57) ABSTRACT

A memory device is a provided that includes memory cells situated at the intersection of lines and columns, and a dummy path including a first dummy column having two bit lines to which there are connected dummy memory cells, and a circuit adapted to select at least one of the dummy memory cells to discharge one of the dummy bit lines. The dummy path also includes at least one second dummy column adapted to generate a dummy leakage current (representing a leakage current of a column of the memory device selected in read mode), and a circuit adapted to copy the dummy leakage current to the one dummy bit line, so that the discharge of the one dummy bit line also depends on the dummy leakage current.

20 Claims, 4 Drawing Sheets

MEMORY DEVICE THAT TAKES LEAKAGE CURRENTS INTO ACCOUNT IN ACTIVATING THE READ AMPLIFIERS

CROSS-REFERENCE TO RELATED APPLICATIONS

This application is based upon and claims priority from French Patent Application No. 07 02413, filed Apr. 2, 2007, the entire disclosure of which is herein incorporated by reference.

FIELD OF THE INVENTION

The present invention concerns the field of integrated circuit memories, and more particularly devices and methods that take leakage currents on the bit lines into account in controlling the read amplifiers of the memory columns.

BACKGROUND OF THE INVENTION

FIG. 1 illustrates a memory plane MEM of the SRAM (Static Random Access Memory) type. The memory plane MEM conventionally includes word lines WLi and columns COLj, which each include two bit lines BLT and BLF.

The memory cells of such a memory plane, illustrated in detail in FIG. 2, are connected differentially between two bit lines BLT and BLF of each column of the memory plane and can be activated by a word line WLi. Moreover, read amplifiers SA are disposed at the foot of the columns of the memory plane and are conventionally activated by an activation signal delivered by a control circuit MC.

A memory cell of the memory plane is shown in FIG. 2. The memory cell has a first inverter gate IA and a second inverter gate IB connected in opposite orientations between a first node A and a second node B. A first access transistor TA is provided, with its drain connected to the node A, its gate connected to a word line WL of the memory plane, and its source connected to a first bit line BLT. A second access transistor TB is also provided, with its drain connected to the node B, its gate connected to the word line WL, and its source connected to the second bit line BLF of the column of the memory cell.

FIG. 3 depicts N+1 of such memory cells P0-PN, associated so as to form a column of the SRAM memory, at the foot of which a differential read amplifier SA is provided. All the memory cells P0-PN are connected to the same bit lines BLT and BLF. On the other hand, each memory cell is connected to a different word line WL0-WLN. The amplifier SA has two differential inputs connected respectively to the first bit line BLT and the second bit line BLF.

To program a memory cell in the column of memory cells, a potential Vdd is applied to the word line WL associated with the cell to be programmed and, according to the data item 0 or 1 to be programmed in the cell selected, a zero potential (connection to ground) or the potential Vdd is applied to the first bit line BLT, and a potential that is the inverse of the potential applied to the first bit line BLT is applied to the second bit line BLF. For example, in order to program a logic 0 in the memory cell P0, Vdd is applied to the word line WL0, as well as to the second bit line BLF, and the first bit line BLT is connected to ground. Thus, after the programming of a 0, the node A0 is at zero potential and the node B0 is at the potential Vdd.

During an operation for reading this memory cell P0, the two lines BLT and BLF are first precharged to the supply potential Vdd, and the corresponding word line WL0 is subjected to the potential Vdd (WL0=logic 1) in order to select the memory cell P0 in read mode (with the other word lines being connected to ground: WL1-WLN=logic 0). Then the two bit lines BLT and BLF are made to float. With the word line WL0 at the high potential Vdd, the access transistors TA0 and TB0 of the cell are on. In addition, according to this example, as the node A0 of the cell P0 is at 0 and the first line BLT is at the potential Vdd, the two sides of the channel of the transistor TA0 are at different potentials so a current Iread flows through this channel. This current Iread will discharge the first bit line BLT and thus progressively return its potential to 0. On the other hand, as the node B0 of the memory cell and the second bit line BLF are at the same potential Vdd, the two sides of the channel of the transistor TB0 are at the same potential and no current flows in this channel. The second bit line BLF is therefore assumed to remain at its high precharge state (that is, at the potential Vdd).

After a certain length of time, the amplifier SA detects a difference in potential between the bit lines BLT and BLF, which, when it is greater than the input offset voltage of the amplifier, produces at the output of the amplifier a data signal corresponding to the data item stored in the selected memory cell.

Reading is thus possible only if a difference in potential of sufficient amplitude (greater than the offset voltage of the amplifier) appears between the bit lines BLT and BLF.

So that the amplifier can correctly detect the difference in potential expected between the two bit lines BLT and BLF and thus obtain the correct read value, it is therefore essential for the amplifier to be activated at the correct time, that is when the difference in potential between the two bit lines, the one discharging and the one assumed to remain at its high precharged state, is greater than the offset voltage of the amplifier.

However, a phenomenon of leakage currents inherent in the access transistors of the memory cells in the column complicates the control of the activation of the read amplifier. More precisely, because of stray leakage currents in the memory cells of the column being read, the second bit line BLF that is assumed to remain at its high precharged state is in reality also drawn toward ground.

This is because, even when correctly blocked by an appropriate potential applied to its gate, a transistor has leak current when a difference in potential appears between its drain and source. In the example in FIG. 3, with the memory cell P0 storing a logic 0, it is assumed that the other memory cells P1-PN store the inverse data item, namely a logic 1. The nodes A1-AN are thus at 1 and the nodes B1-BN are at 0. With the memory cell P0 being selected in read mode (WL0=1), although the access transistors TB1-TBN are off (WL1-WLN=0), leakage currents Ioff are nevertheless established between the drain and the source of the transistors TB1-TBN, related to the difference in potential between the second bit line BLF precharged to the high state and the nodes B1-BN at 0. These leakage currents Ioff will together progressively discharge the potential of the bit line BLF, which was assumed to remain at its high precharged state and, consequently, reduce the signal applied to the input of the read amplifier.

Normally, the memory is equipped with a reference path ("dummy path") CHdum (FIG. 1) that is intended to automatically adjust the time of delivery by the control circuit MC of the activation signal that activates the read amplifiers disposed at the foot of the columns of the memory plane.

This dummy path includes a dummy column, formed by two dummy bit lines DBLT and DBLF. Dummy memory cells CELDi are connected to this dummy column, and at least one of them CELD1 is activated by a dummy word line DWL.

The dummy memory cell CELD1 activated by the dummy word line DWL is programmed so as to discharge (to draw toward ground) one of the dummy bit lines, with the other having the leakage current pass through it. The dummy bit line that is intended to be discharged when the dummy cell CELD1 is activated is then used, in a known manner, to generate the activation signal Act for activating the read amplifiers of the memory plane through the control circuit MC. For example, the dummy bit line intended to be discharged when the dummy cell is activated is connected to the input of an inverter gate provided within the control circuit MC to deliver the activation signal Act.

In practice, several dummy memory cells CELD1-CELDn are in fact activated by the word line DWL so as to produce a discharge of the dummy bit line that is more rapid than the discharge of a standard bit line BLT of a column in the memory plane.

Moreover, in order to compensate for the effects of the leakage currents mentioned above and to obtain a memory that functions in a high temperature range in particular, a delay circuit is generally inserted in the dummy path, in order to delay the delivery of the activation signal for activating the read amplifiers so as to obtain a correct functioning of the memory in a worst case situation (for example, when there is a high temperature for which the leakage currents are high).

However, such a solution, though it leads to acceptable performance in the worst case situation, degrades the performance of the memory in the intermediate and normal operating situations.

Another solution is to actually take into account the leakage current of the bit line that is not supposed to discharge in the activation of the read amplifiers, at each column of the memory plane. Such a solution consists of, during an operation for reading a memory cell, first evaluating the leakage current of each of the bit lines in order to then be able to re-inject this leakage current of each of the two bit lines into the other, so that the effect of the leakage currents in each of the two bit lines thus compensate for each other mutually.

This solution is however expensive, in particular in terms of size occupied by the memory, because it involves providing specific circuitry at each of the columns of the memory plane, both to evaluate the leakage currents and to re-inject these leakage currents into the bit lines during the reading operation.

In addition, the phase of evaluating the leakage current on the bit line that is not supposed to discharge, having to be implemented prior to any read phase itself, is detrimental in terms of the operating speed of the memory.

SUMMARY OF THE INVENTION

The present invention aims to overcome the aforementioned drawbacks and to provide devices and methods that take into account the leakage currents of the bit lines in activating the read amplifiers.

One embodiment of the present invention provides a memory device that includes a memory plane having memory cells situated at the intersection of lines and columns of the memory plane, read amplifiers coupled to the columns of the memory plane, and a dummy path adapted to deliver an activation signal for activating the read amplifiers of the columns of the memory plane. The dummy path includes a first dummy column having dummy memory cells, two dummy bit lines to which the dummy memory cells are connected, and a circuit adapted to selecting at least one of the dummy memory cells to discharge one of the dummy bit lines by a discharge current that is adapted to control the delivery of the activation signal characterized. The dummy path further including at least a second dummy column of dummy memory cells adapted to generate a dummy leakage current that represents a leakage current of a column of the memory plane that is selected in read mode, and a circuit adapted to copy the dummy leakage current to the one dummy bit line of the first dummy column that is discharged by the discharge current, so that the discharge of the one dummy bit line of the first dummy column is also dependent on the dummy leakage current.

Another embodiment of the present invention provides a method of controlling delivery of an activation signal for activating read amplifiers that are coupled to the columns of a memory plane of a memory. The memory includes a dummy path comprising a first dummy column having two dummy bit lines to which dummy memory cells are connected. According to the method, at least one of the dummy memory cells is selected to discharge one of the dummy bit lines by a discharge current that is adapted to control the delivery of the activation signal. There is generated a dummy leakage current that represents a leakage current of a column of the memory plane that is selected in read mode, and the dummy leakage current is copied during a reading operation to the one dummy bit line that is discharged by the discharge current, so that the discharge current of the one dummy bit line is compensated for by the dummy leakage current.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF THE PREFERRED EMBODIMENTS

Figure 1:
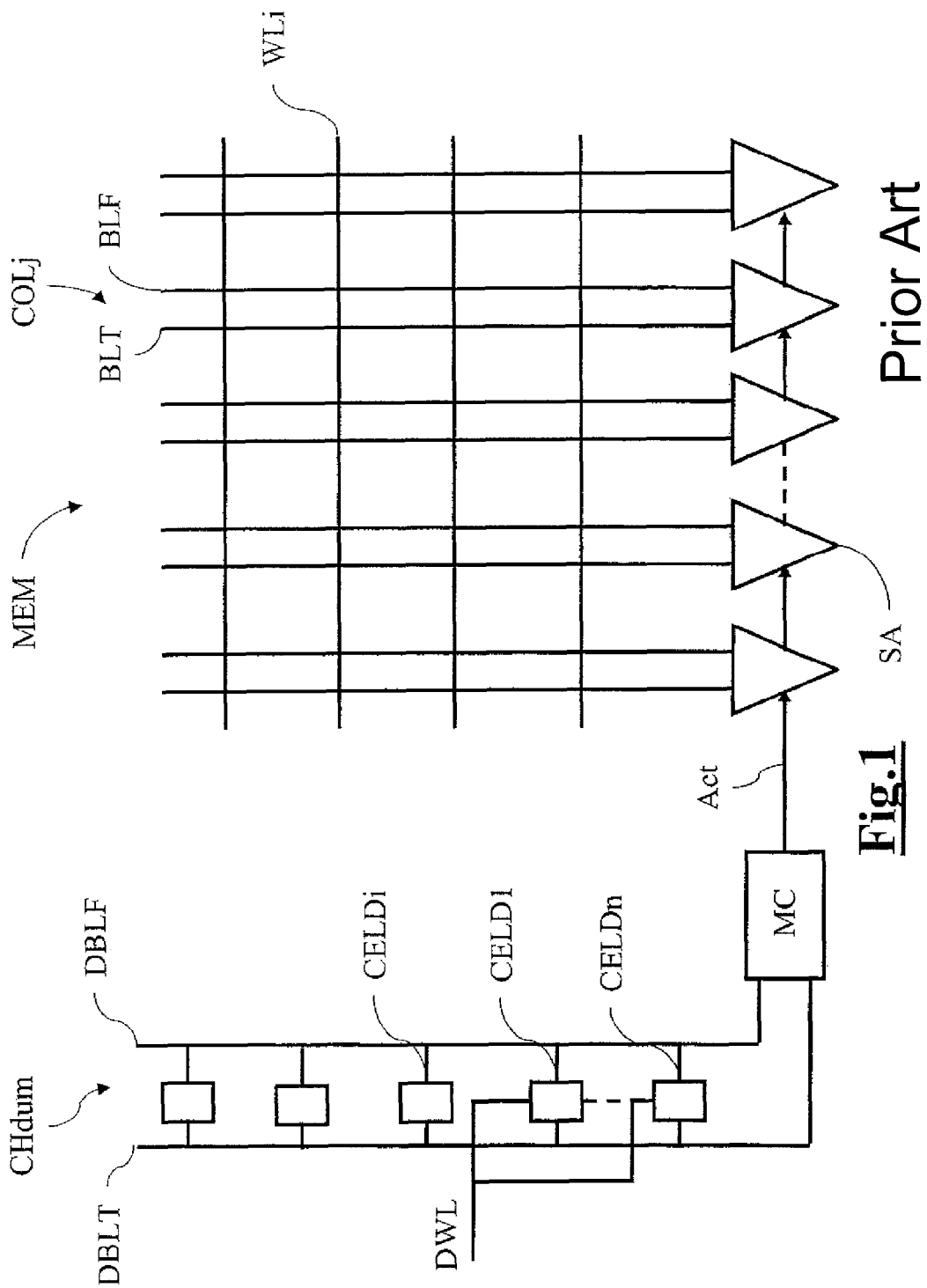
FIG. 1 illustrates a conventional memory device of the SRAM type that is equipped with a dummy path for delivering an activation signal for read amplifiers of the memory.
Figure 2:
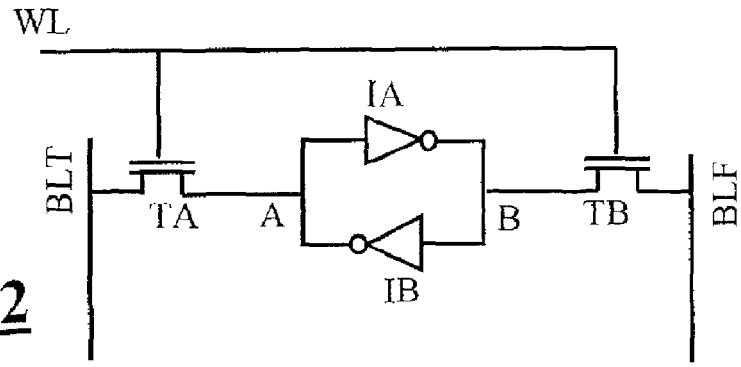
FIG. 2 illustrates a conventional architecture of a standard memory cell of the memory device of FIG. 1.
Figure 3:
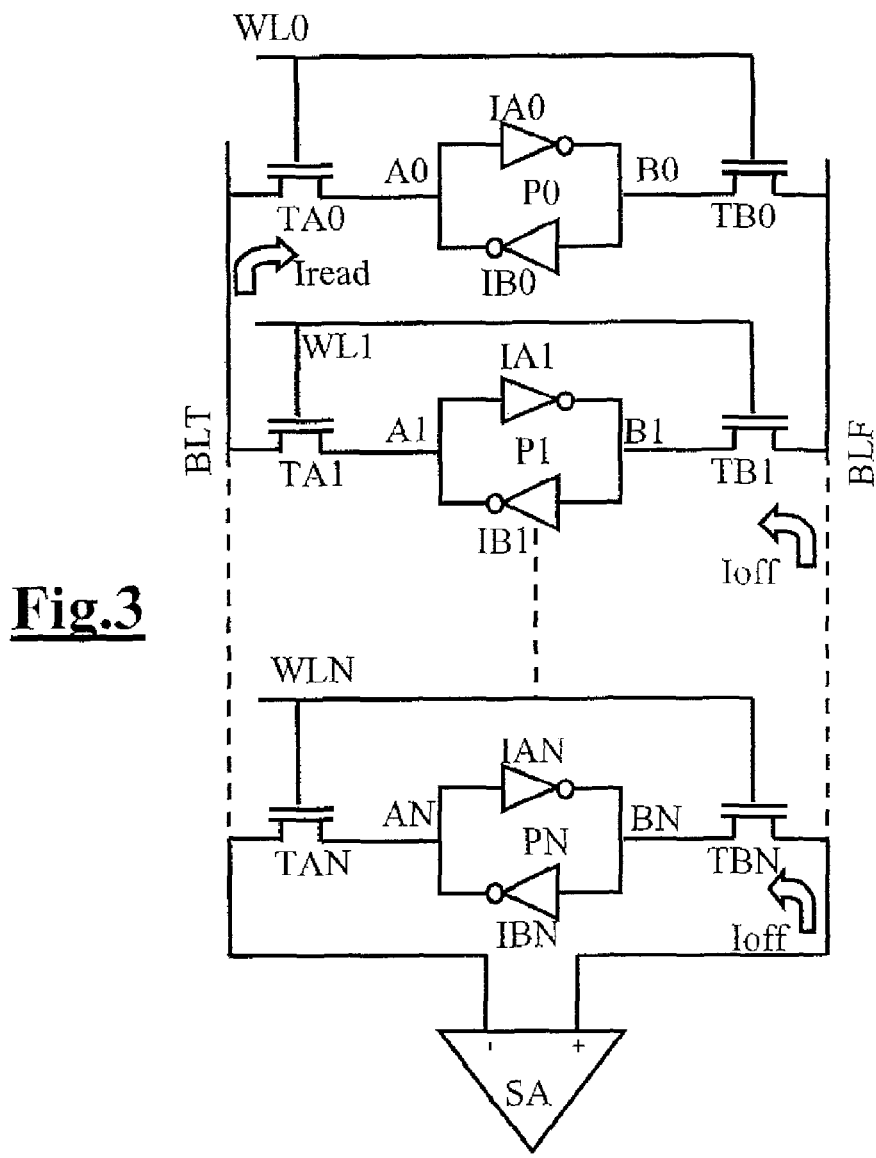
FIG. 3 illustrates in more detail a column of the memory cells of the memory device of FIG. 1.

Preferred embodiments of the present invention will be described in detail hereinbelow with reference to the attached drawings.

The principle of the present invention is, during an operation for reading a memory cell of a column of a memory plane, taking into account the voltage drop, due to the leakage currents, on the bit line that is not supposed to discharge, by acting at the dummy path that is designed to automatically adjust for the time of delivery of the signal that activates the read amplifier of the column in read mode.

Preferred embodiments of the present invention provide a memory device that includes a memory plane having memory cells situated at the intersection of lines and columns of the memory plane, read amplifiers coupled to the columns of the memory plane, and a dummy path adapted to deliver an activation signal for activating the read amplifiers of the columns of the memory plane. The dummy path includes a first dummy column having dummy memory cells, two dummy bit lines to which the dummy memory cells are connected, and a circuit adapted to selecting at least one of the dummy memory cells to discharge one of the dummy bit lines by a discharge current that is adapted to control the delivery of the activation signal characterized. The dummy path further including at least a second dummy column of dummy memory cells adapted to generate a dummy leakage current that represents a leakage current of a column of the memory plane that is selected in read mode, and a circuit adapted to copy the dummy leakage current to the one dummy bit line of the first dummy column that is discharged by the discharge current, so that the discharge of the one dummy bit line of the first dummy column is also dependent on the dummy leakage current.

In one embodiment, the second dummy column comprises the same number of memory cells as a column of memory cells of the memory plane, so that the dummy leakage current generated by the second dummy column corresponds to the leakage currents of all of the memory cells of a column of the memory plane selected in read mode.

In some embodiments, the dummy memory cells of the second dummy column of the dummy path are connected to a dummy bit line of the second column through transistors in their off state.

Preferably, the circuit adapted to copy the dummy leakage current comprises a current mirror that is connected between the dummy bit line of the second dummy column and the one dummy bit line of the first dummy column that is discharged by the discharge current.

Preferably, the supply voltage of the current mirror is higher than a dummy bit line precharging voltage.

In one embodiment, the current mirror comprises a feedback loop adapted to act on the supply voltage of the current mirror in order to ensure that the dummy bit line of the second dummy column is at the dummy bit line precharging voltage.

Preferably, the memory device also includes a circuit adapted to deactivate the current mirror outside of any read operation.

According to one embodiment, the activation signal for activating the read amplifiers is generated by a control circuit comprising an inverter gate that is controlled by the discharge current of the one dummy bit line of the first dummy column that is discharged by the discharge current.

The present invention also provides a method of controlling delivery of an activation signal for activating read amplifiers that are coupled to the columns of a memory plane of a memory. The memory includes a dummy path comprising a first dummy column having two dummy bit lines to which dummy memory cells are connected. According to the method, at least one of the dummy memory cells is selected to discharge one of the dummy bit lines by a discharge current that is adapted to control the delivery of the activation signal. There is generated a dummy leakage current that represents a leakage current of a column of the memory plane that is selected in read mode, and the dummy leakage current is copied during a reading operation to the one dummy bit line that is discharged by the discharge current, so that the discharge current of the one dummy bit line is compensated for by the dummy leakage current.

Exemplary embodiments of the present invention will now be described in detail with reference to FIGS. 4-6.

Figure 4:
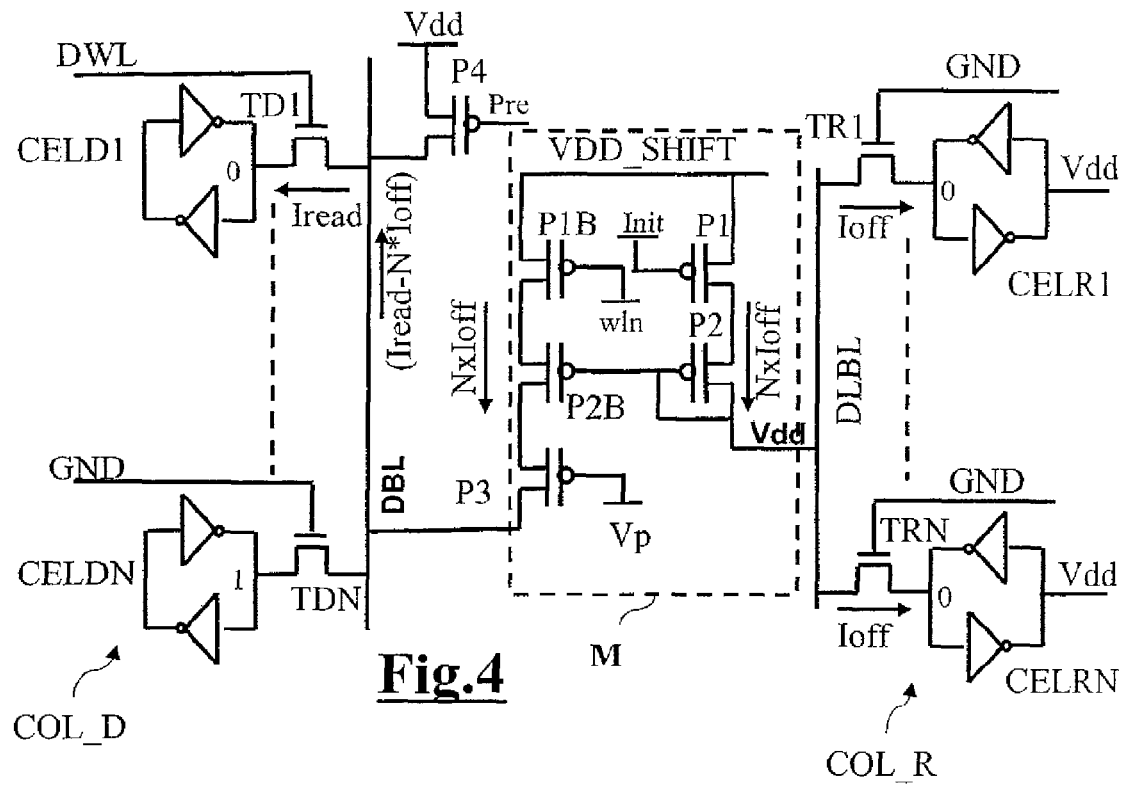
FIG. 4 illustrates an embodiment of the present invention.

FIG. 4 illustrates a dummy path according to an embodiment of the present invention. The dummy path includes a first dummy column COL_D, which is substantially identical to the dummy column of FIG. 1. Thus, this first dummy column is formed by two dummy bit lines, only one of which DBL is shown in FIG. 4 for simplicity. Dummy memory cells CELD1 to CELDN are connected to this dummy column by access transistors. Only the access transistors TD1 to TDN connecting the cells to the bit line DBL are shown for simplicity. Only one of these dummy cells, for example CELD1, has its access transistor TD1 controlled by the dummy word line DWL. The other dummy cells are designed to be inactive, with their access transistors being maintained in the off state (that is, their gates are connected to ground GND).

The dummy bit line DBL is also connected to the drain of a transistor P4, the source of which is connected to the supply potential Vdd. The transistor P4, controlled by a signal Pre applied to its gate, has the role of precharging the dummy bit line DBL to the supply potential Vdd, outside of the memory reading cycles.

The dummy memory cell CELD1 is programmed so that, during a memory reading cycle, when the access transistor TD1 of this cell is activated by the appropriate signal (DWL=logic 1), the cell is on and a current Iread flows through its channel. Thus, a current Iread will discharge the dummy bit line DBL, which was previously precharged to the supply potential Vdd, and progressively return its potential to 0.

The other dummy cells of the dummy column COL_D are programmed in opposite fashion to the cell CELD1, so that, with the access transistors of these cells being in their off state (ground GND applied to their gates), the discharge of the other dummy bit line of the column is caused by leakage currents of these access transistors.

According to this embodiment of the present invention, the dummy path of the memory further includes at least one second dummy column COL_R, which is used solely for the purpose of generating a leakage current representing the leakage current of a column COLj of the memory plane selected in read mode.

To do this, the second dummy column COL_R includes multiple dummy memory cells CELR1 to CELRN each connected at a first side, via an access transistor TR1 to TRN, to a dummy bit line DLBL of the second dummy column COL_R and at the other side to Vdd.

The second dummy column COL_R has, in this exemplary embodiment, the same number N of dummy memory cells CELR1 to CELRN as the number of memory cells constituting a column COLj of the memory plane.

Using a second dummy column with N cells, which are programmed with a data item opposite to the one contained in the cell selected for discharging the dummy bit line DBL, makes it possible to take into account a worst case in which the leakage current of a column is at the maximum. In other words, the N dummy cells of the second dummy column make it possible to model the maximum leakage of N memory cells of a column of the memory plane.

The cells CELR1 to CELRN constituting the second dummy column are therefore designed to be inactive (that is, their access transistors are maintained in the off state: GND at their gates) and are programmed in the opposite fashion of the cell CELD1 that is activated in the first dummy column (that is, with a 0 on the internal node on the left-hand side of the cell in FIG. 4).

With the bit line DLBL of the second dummy column being precharged to Vdd, the transistors TR1 to TRN, although being in the off state, each have a leakage current Ioff, since a difference in potential equal to Vdd appears between their drain and source. All these leakage currents N×Ioff will therefore lead to the bit line DLBL of the second dummy column being drawn toward ground, in this way simulating the discharge of the bit line that is not supposed to discharge of a column of the memory plane selected in read mode, due to the leakage current of all the memory cells in the columns.

The dummy leakage current N×Ioff is then copied by a current mirror M in order to be re-injected during a read cycle into the dummy bit line DBL of the first dummy column, the discharge of which is used for controlling the delivery of the signal for activating the read amplifiers of the memory plane. To do this, the current mirror M that allows the copying of the dummy leakage current N×Ioff to the dummy bit line DBL is connected between the dummy bit line DBLB of the second dummy column COL_R and the dummy bit line DBL. For correct functioning of the current mirror, it is necessary to supply it with a voltage VDD_SHIFT that is higher that the precharging voltage Vdd of the bit lines.

In this embodiment, PMOS transistors P1, P2, P1B, and P2B form the current mirror M, which is then driven by the dummy leakage current N×Ioff generated by the second reference column COL_R. The current mirror stage M is made conductive during a read cycle via a synchronization signal wln (wln=logic 0) that is supplied to the gate of the transistor P1B. The signal wln is a signal that is the inverse of the signal DWL that activates a memory cell of the first dummy column. The transistor P1B thus provides control of the current supplied by the current mirror M by managing the duration of the re-injection of the dummy leakage current N×Ioff into the dummy bit line DBL. The transistor P1B thus makes it possible to inject the current N×Ioff into the dummy bit line DBL only when the precharging of the dummy bit line DBL (controlled by the signal Pre) is inactive, in other words during a read operation itself, during which the dummy bit line DBL discharges. Outside any read cycle, the bit lines are precharged and the transistor P1B is then advantageously controlled (wln=logic 1) so as to deactivate the current mirror in order to avoid any static consumption of the circuit.

Moreover, in this embodiment a transistor P3 is provided between the output of the current mirror stage M and the dummy bit line DBL, in order to mask the variations in the voltage of the dummy bit line to the current mirror. The voltage on the node between P3 and P2B will thus be more constant than that of the dummy bit line DBL, which advantageously avoids variations in the current N×Ioff produced by the current mirror.

The signal Init controlling the transistor P1 of the current mirror makes it possible, when it is replaced by ground GND, to put the copying system on standby.

The device according to this embodiment of the present invention thus makes it possible to discharge the dummy bit line DBL of the first dummy column by a discharge current (Iread-N*Ioff). The use of such a discharge current for the dummy bit line DBL, where the normal discharge current Iread is compensated for by the dummy leakage current N×Ioff injected into the bit line DBL, makes it possible to take into account the leakage of the non-conducting access transistors of the cells of a column of the memory plane in controlling the signal for activating the read amplifiers of the memory plane.

According to the above embodiment, a single dummy memory cell CELD1 is selected to discharge the dummy bit line DBL of the first reference column, the discharge of which is used for controlling the delivery of the signal for activating the read amplifiers of the memory.

In another embodiment, P dummy memory cells can be selected for discharging the dummy bit line DBL, which then has the discharge current P×Iread pass through it. In this case, the second dummy column COL_R is duplicated P times (that is, as many times as there are cells selected for discharging the dummy bit line DBL), so as to have P dummy columns COL_R connected in parallel. This is because, as there is P×Iread that discharges the reference bit line DBL, it is therefore necessary to inject P×N×Ioff on this dummy bit line in order to have a discharge proportional to the establishment of the signal on a normal bit line of the memory plane.

Figure 5:
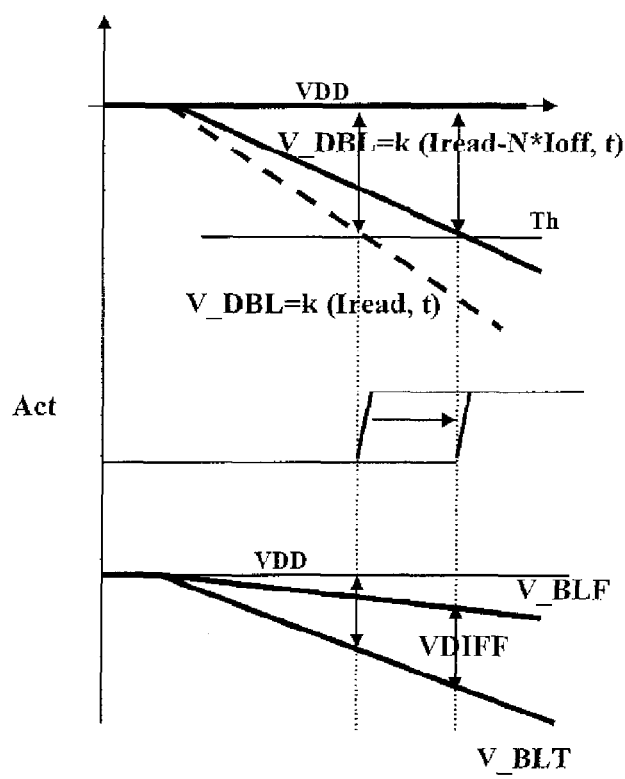
FIG. 5 depicts timing diagrams illustrating the discharge of the dummy bit line used for controlling the read amplifier activation signal, without taking into account the leakage currents and with taking into account the leakage currents in accordance with the principles of the present invention.
Figure 6:
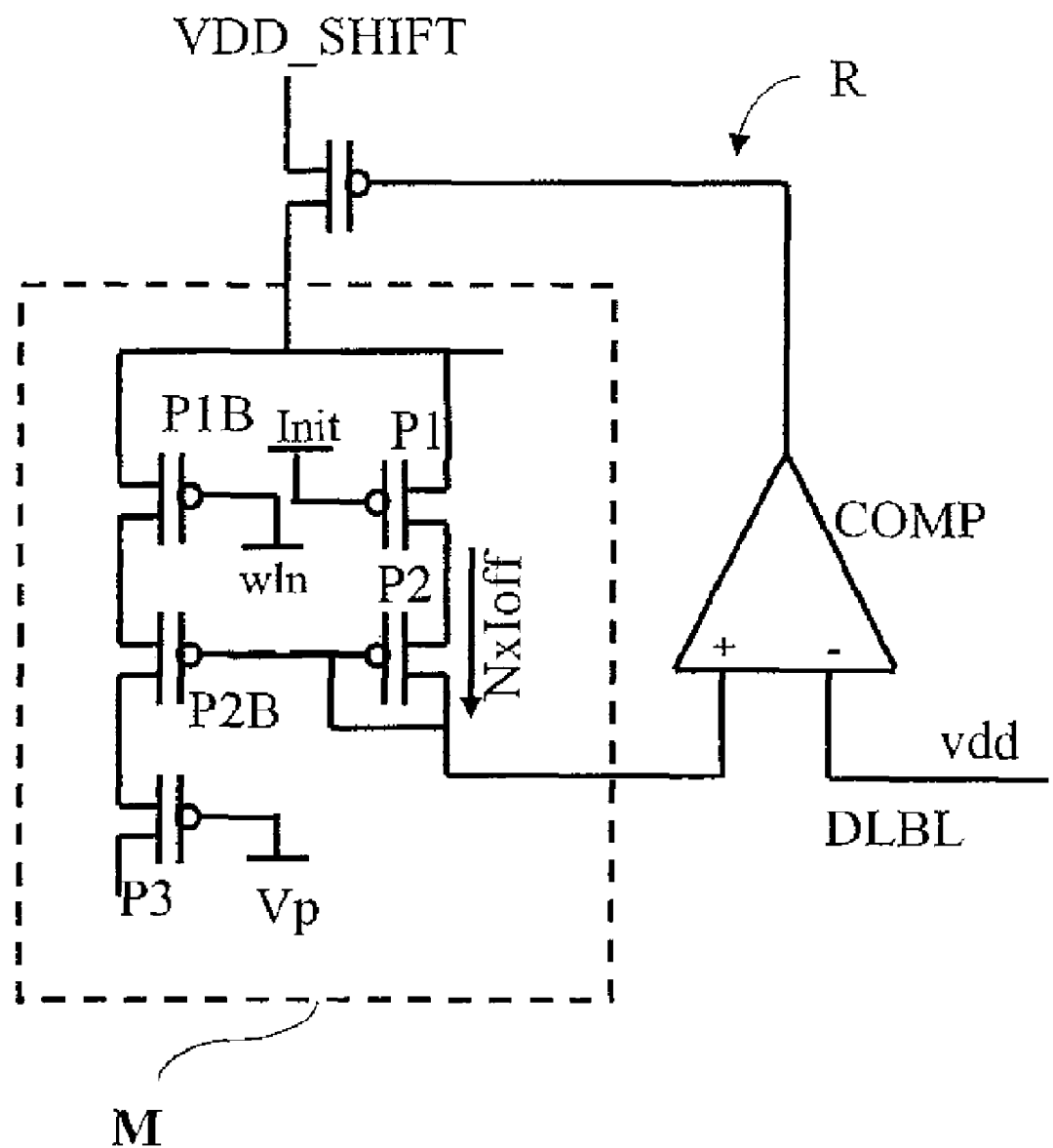
FIG. 6 illustrates an alternative embodiment of the current mirror circuit of FIG. 4.

The three timing diagrams of FIG. 5 illustrate, from top to bottom:

the drop in potential V_DBL on the dummy bit line DBL used for controlling the signal for activating the read amplifiers, according to the current Iread only (shown as a broken line) and according to the current Iread−N*Ioff;

the signal Act activating the read amplifiers; and the discharge potential V_BLT of the bit line BLT of a column of the memory plane selected in read mode and the discharge potential V_BLF of the bit line BLF of the column that is not supposed to discharge, but which in fact discharges slowly because of the leakage currents.

The signal for activating the read amplifiers Act is delivered when the discharge signal V_DBL of the dummy bit line, a function of Iread and N*Ioff, passes below a certain threshold Th, which corresponds to the threshold of the inverter gate of the control circuit MC, according to the example in which the control circuit comprises an inverter gate.

By thus controlling the activation signal Act by a discharge signal V_DBL that is a function of Iread and N*Ioff, the delivery of the activation signal Act will be delayed, so that the potential distance VDIPF between the bit line BLT and the bit line BLF of the column of the memory plane in read mode is then sufficient to allow correct reading by the amplifier.

The present invention therefore makes it possible to take into account the leakage currents of the column of the memory plane in read mode in order to adapt the delivery of the signal for activating the read amplifier, and this without the necessity of providing an evaluation phase of the leakage currents as in the conventional compensation circuits.

One constraint to be taken into account for a correct functioning of the device is to apply a suitable voltage VDD_SHIFT to the current mirror M, without the current mirror being able to unfavorably influence the voltage on the dummy bit line DLBL used to emulate the leakage current N×Ioff. For this purpose, another embodiment of the present invention alters the current mirror circuit of FIG. 4 by providing a feedback loop R that is interposed between the current mirror and the dummy bit line DLBL, and that acts on an additional transistor for controlling the application of the correct voltage VDD_SHIFT to the current mirror according to the voltage on the dummy bit line DLBL. As shown in FIG. 6, such a feedback loop of an exemplary embodiment includes a comparator COMP for comparing the values of the voltages on the dummy bit line and at the input of the current mirror. The feedback on VDD_SHIFT thus makes it possible to ensure that the dummy bit line is indeed precharged to Vdd.

While the above description relates to an SRAM memory, the present invention is not exclusively for SRAM memories. The present invention is also suitable for use with other types of memories.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A memory device comprising:
    a memory plane including memory cells at the intersection of lines and columns of the memory plane;
    read amplifiers coupled to the columns of the memory plane; and
    a dummy path adapted to deliver an activation signal for activating the read amplifiers,
    wherein the dummy path includes:
        a first dummy column including dummy memory cells, two dummy bit lines to which the dummy memory cells are connected, and a circuit adapted to select at least one of the dummy memory cells to discharge one of the dummy bit lines by a discharge current that is adapted to control delivery of the activation signal;
        at least one second dummy column including dummy memory cells, the at least one second dummy column being adapted to generate a dummy leakage current that represents a leakage current of a column of the memory plane that is selected in read mode; and
        a circuit adapted to copy the dummy leakage current to the one dummy bit line of the first dummy column that is discharged by the discharge current, so that the discharge of the one dummy bit line of the first dummy column is also dependent on the dummy leakage current.

2. The memory device according to claim 1, wherein the second dummy column comprises a number of dummy memory cells equal to a number of the memory cells in each of the columns of the memory plane, so that the dummy leakage current generated by the second dummy column corresponds to the leakage currents of all of the memory cells of one of the columns of the memory plane selected in read mode.

3. The memory device according to claim 1, wherein the dummy memory cells of the second dummy column of the dummy path are connected to a dummy bit line of the second dummy column through transistors in their off state.

4. The memory device according to claim 3, wherein the circuit adapted to copy the dummy leakage current comprises a current mirror that is connected between the dummy bit line of the second dummy column and the one dummy bit line of the first dummy column that is discharged by the discharge current.

5. The memory device according to claim 4, wherein a supply voltage that supplies the current mirror is higher than a precharging voltage for the dummy bit lines.

6. The memory device according to claim 5, wherein the current mirror comprises a feedback loop adapted to act on the supply voltage that supplies the current mirror so as to ensure that the dummy bit line of the second dummy column is at the precharging voltage for the dummy bit lines.

7. The memory device according to claim 4, further comprising a circuit adapted to deactivate the current mirror outside of any read operation.

8. The memory device according to claim 1, wherein the circuit adapted to select at least one of the dummy memory cells comprises a dummy word line of the dummy path.

9. The memory device according to claim 1, wherein the dummy path further includes a control circuit that generates the activation signal for activating the read amplifiers.

10. The memory device according to claim 9, wherein the control circuit comprises an inverter gate that is coupled to the one dummy bit line of the first dummy column that is discharged by the discharge current.

11. The memory device according to claim 1, wherein the at least one second dummy column includes at least two second dummy columns of dummy memory cells.

12. A method of controlling delivery of an activation signal for activating read amplifiers that are coupled to columns of a memory plane of a memory, the memory including a dummy path comprising a first dummy column including two dummy bit lines to which dummy memory cells are connected, the method comprising:
    selecting at least one of the dummy memory cells to discharge one of the dummy bit lines by a discharge current that is adapted to control the delivery of the activation signal;
    generating a dummy leakage current that represents a leakage current of a column of the memory plane that is selected in read mode; and
    copying the dummy leakage current during a reading operation to the one dummy bit line that is discharged by the discharge current, so that the discharge current of the one dummy bit line is compensated for by the dummy leakage current.

13. The method according to claim 12, wherein the generating step comprises using at least one second dummy column including dummy memory cells to generate the dummy leakage current.

14. The method according to claim 13, wherein the copying step comprises using a current mirror to copy the dummy leakage current during the reading operation.

15. The method according to claim 14, wherein the current mirror comprises a feedback loop adapted to act on a supply voltage that supplies the current mirror.

16. A computer system including at least one memory device, the memory device comprising:
    a memory plane including memory cells at the intersection of lines and columns of the memory plane;
    read amplifiers coupled to the columns of the memory plane; and
    a dummy path adapted to deliver an activation signal for activating the read amplifiers,
    wherein the dummy path includes:
        a first dummy column including dummy memory cells, two dummy bit lines to which the dummy memory cells are connected, and a circuit adapted to select at least one of the dummy memory cells to discharge one of the dummy bit lines by a discharge current that is adapted to control delivery of the activation signal;
        at least one second dummy column including dummy memory cells, the at least one second dummy column being adapted to generate a dummy leakage current that represents a leakage current of a column of the memory plane that is selected in read mode; and
        a circuit adapted to copy the dummy leakage current to the one dummy bit line of the first dummy column that is discharged by the discharge current, so that the discharge of the one dummy bit line of the first dummy column is also dependent on the dummy leakage current.

17. The computer system according to claim 16, wherein the second dummy column of the dummy path of the memory device comprises a number of dummy memory cells equal to a number of the memory cells in each of the columns of the memory plane, so that the dummy leakage current generated by the second dummy column corresponds to the leakage currents of all of the memory cells of one of the columns of the memory plane selected in read mode.

18. The computer system according to claim 16, wherein the dummy memory cells of the second dummy column of the dummy path of the memory device are connected to a dummy bit line of the second dummy column through transistors in their off state.

19. The computer system according to claim 16, wherein the circuit adapted to select at least one of the dummy memory cells comprises a dummy word line of the dummy path.

20. The computer system according to claim 16, wherein the dummy path of the memory device further includes a control circuit that generates the activation signal for activating the read amplifiers.

* * * * *